US012685043B2

(12) United States Patent
Bhuyan et al.

(10) Patent No.: US 12,685,043 B2
(45) Date of Patent: Jul. 14, 2026

(54) REACTIVE-ION DEPOSITION PROCESSES FOR DIELECTRIC MATERIAL FORMATION

(71) Applicant: Applied Materials, Inc., Santa Clara, CA (US)

(72) Inventors: Bhaskar Jyoti Bhuyan, Santa Clara, CA (US); Mark J. Saly, Morgan Hill, CA (US); Lakmal Charidu Kalutarage, San Jose, CA (US); Feng Q. Liu, San Jose, CA (US); Jeffrey W. Anthis, Redwood City, CA (US); Abhijit Basu Mallick, Fremont, CA (US); Akhil Singhal, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 332 days.

(21) Appl. No.: 18/229,884

(22) Filed: Aug. 3, 2023

(65) Prior Publication Data

US 2025/0046602 A1 Feb. 6, 2025

(51) Int. Cl.

*C23C 14/10* (2006.01)
*C23C 14/00* (2006.01)

(Continued)

(52) U.S. Cl.

CPC ...... *H10P 14/6336* (2026.01); *C23C 14/0036* (2013.01); *C23C 14/042* (2013.01); *C23C 14/046* (2013.01); *C23C 14/0635* (2013.01); *C23C 14/0652* (2013.01); *C23C 14/10* (2013.01); *C23C 14/34* (2013.01); *C23C 14/5873* (2013.01); *H10P 14/6682* (2026.01); *H10P 14/6686* (2026.01);

(Continued)

(58) Field of Classification Search

CPC . C23C 14/0036; C23C 14/042; C23C 14/046; C23C 14/0635; C23C 14/0652; C23C 14/10; C23C 14/34; C23C 14/5873; C23C 16/04; C23C 16/047; C23C 16/325; C23C 16/36; C23C 16/401; C23C 16/56; H01L 21/02164; H01L 21/02167; H01L 21/0217; H01L 21/02211; H01L 21/02216; H01L 21/02271; H01L 21/02274

See application file for complete search history.

(56) References Cited

U.S. PATENT DOCUMENTS

| | | | | |
|---|---|---|---|---|
| 7,838,133 | B2 * | 11/2010 | Zhang | C23C 14/088 204/192.15 |
| 8,575,033 | B2 * | 11/2013 | Weldman | C23C 16/325 438/767 |

(Continued)

FOREIGN PATENT DOCUMENTS

| | | | |
|---|---|---|---|
| CN | 116487448 | A | 7/2023 |
| KR | 101477494 | B1 | 12/2014 |

OTHER PUBLICATIONS

International Search Report and Written Opinion for International Application No. PCT/US2024/040832 mailed Nov. 22, 2024, 14 Pages.

*Primary Examiner* — Jaehwan Oh

(74) *Attorney, Agent, or Firm* — Lowenstein Sandler LLP

(57) ABSTRACT

A method includes obtaining a base structure of an electronic device, the base structure including at least one opening, and forming, using a reactive-ion deposition process, a dielectric material within the at least one opening.

20 Claims, 6 Drawing Sheets

(51) Int. Cl.

| | |
|---|---|
| ***C23C 14/04*** | (2006.01) |
| ***C23C 14/06*** | (2006.01) |
| ***C23C 14/34*** | (2006.01) |
| ***C23C 14/58*** | (2006.01) |
| ***H10P 14/60*** | (2026.01) |
| ***H10P 14/69*** | (2026.01) |
| ***H10P 14/692*** | (2026.01) |
| ***H10P 14/694*** | (2026.01) |

(52) U.S. Cl.
CPC .... *H10P 14/6905* (2026.01); *H10P 14/69215* (2026.01); *H10P 14/69433* (2026.01)

(56) References Cited

U.S. PATENT DOCUMENTS

| | | | | |
|---|---|---|---|---|
| 2002/0125123 | A1 | 9/2002 | Ngan et al. | |
| 2007/0281495 | A1* | 12/2007 | Mallick | C23C 16/045 257/E21.252 |
| 2013/0065404 | A1* | 3/2013 | Weidman | C23C 16/325 438/786 |
| 2014/0038427 | A1* | 2/2014 | Weidman | C23C 16/325 438/778 |
| 2017/0294348 | A1* | 10/2017 | Mebarki | H10W 20/069 |
| 2017/0323785 | A1* | 11/2017 | Singhal | H10P 14/6336 |
| 2022/0059348 | A1 | 2/2022 | Kang et al. | |

* cited by examiner

300E

300D

REACTIVE-ION DEPOSITION PROCESSES FOR DIELECTRIC MATERIAL FORMATION

TECHNICAL FIELD

Embodiments of the present disclosure generally relate to electronic device fabrication. Particularly, embodiments of the present disclosure relate to reactive-ion deposition (RID) processes for dielectric material formation.

BACKGROUND

An electronic device manufacturing apparatus can include multiple chambers, such as process chambers and load lock chambers. Such an electronic device manufacturing apparatus can employ a robot apparatus in the transfer chamber that is configured to transport substrates between the multiple chambers. In some instances, multiple substrates are transferred together. Process chambers may be used in an electronic device manufacturing apparatus to perform one or more processes on substrates, such as deposition processes and etch processes. For many processes gases are flowed into the process chamber. Electronic devices such as semiconductor devices are manufactured by performing a series of operations that may include deposition, oxidation, photolithography, ion implantation, etch, and so on to form many patterned layers.

SUMMARY

In accordance with an embodiment, a method is provided. The method includes obtaining a base structure of an electronic device, the base structure including at least one opening, and forming, using a reactive-ion deposition process, a dielectric material within the at least one opening.

In accordance with another embodiment, a method is provided. The method includes obtaining a base structure of an electronic device, the base structure including at least one opening, and forming, using a reactive-ion deposition process, a dielectric material within the at least one opening. The dielectric material includes at least one of: a silicon oxide material, a silicon nitride material, or a silicon carbide material.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1A:
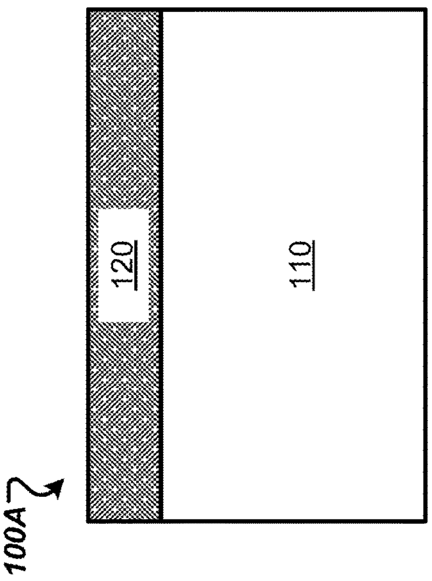
FIGS. 1A-1D are cross-sectional diagrams of an example method of performing a leave-on mask reactive-ion deposition (RID) scheme, in accordance with some embodiments.

Embodiments described herein relate to reactive-ion deposition (RID) processes for dielectric material formation. An electronic device can include a number of different types of layers. For example, an electronic device can include dielectric layers formed from a dielectric material, conductive layers formed from a conductive material, and semiconductor layers formed from a semiconductor material. Electronic device processing techniques can involve performing patterning (e.g., photolithography) to create device structures. For example, patterning can include multiple and repetitive processes of deposition and etching.

Some deposition process can be used to perform gap fill processes. A gap fill process can be used to fill an opening with a material, such as a dielectric material. For example, a gap fill process can be performed to form shallow trench isolation (STI) layers, interlevel dielectric (ILD) layers, passivation layers, etc. Examples of deposition processes that can be used to perform gap fill processes include flowable chemical vapor deposition (CVD), high aspect ratio processes (HARP), atomic layer deposition (ALD) processes, etc. However, material deposited using such processes can be of low quality for gap fill applications, which can lead to void and/or seam issues.

To address these and other drawbacks, embodiments described herein provide for reactive-ion deposition (RID) processes for dielectric material formation. Generally, RID involves using high energy directional ions to deposit a target layer (e.g., film). Due to directionality of the plasma treatment, the target layer can be grown bottom-up without growing significant amount of material on sidewalls of the structure. For example, plasma can be generated from a gas mixture including a process gas. The plasma can include reactive species such as charged particles (e.g., ions) and/or neutral particles (e.g., atoms and/or radicals). The surface of the at least one exposed region of the target layer reacts with the plasma, which results in the etching of the exposed portions of the target layer. The type of process gas within the gas mixture is dependent on the material of the target layer. The reactions between the target layer and the reactive species can generate volatile etch byproducts (e.g., smaller molecules), which can be removed by a vacuum system. The gas mixture can further include an inert gas. For example, the inert gas can include a noble gas, such as helium (He), argon (Ar), neon (Ne), xenon (Xe), krypton (Kr), radon (Rn), etc. In some implementations, the gas mixture can include a mixture of inert gases (i.e., an inert gas mixture). The inert gas (or inert gas mixture) can be used to dilute the gas mixture to control material deposition.

In some embodiments, a dielectric material is a silicon-containing dielectric material. Examples of silicon containing dielectric materials include silicon oxide ($SiO_x$) materials, silicon nitride (SiN) materials, silicon carbide (SiC) materials, silicon oxycarbide (SiCO) materials, silicon oxycarbonitride (SiCON) materials, etc.

In some embodiments, an RID process is a single source precursor process that utilizes a single source precursor to form a dielectric material. More specifically, a single source precursor can be used with a suitable plasma.

In some embodiments, the dielectric material is a silicon oxide material (e.g., $SiO_2$) Examples of single source precursors for RID processes that can be used to form silicon oxide materials include siloxanes and siloxane derivatives. For example, a siloxane derivative can be created by replacing at least one hydrogen (H) atom in a siloxane with at least one of: a methyl group, an alkyl group, an alkene group, an alkyne group, or an aryl group having between 1 carbon atom to about 12 carbon atoms (C1-C12). Examples of suitable plasmas for RID processes that can be used to form silicon oxide materials include oxygen ($O_2$)-containing plasmas and/or ammonia ($NH_3$)-containing plasmas.

In some embodiments, the dielectric material is a silicon nitride material (e.g., $Si_3N_4$). Examples of single source precursors for RID processes that can be used to form silicon nitride materials include silazanes or aminosilanes, and derivatives of silazanes or aminosilanes. For example, a silazane or aminosilane derivative can be created by replacing at least one H atom in a silazane or aminosilane with at least one of: a methyl group, an alkyl group, an alkene group, an alkyne group, or an aryl group having between 1 carbon atom to about 12 carbon atoms (C1-C12). Examples of suitable plasmas for RID processes that can be used to form silicon nitride materials are plasmas containing at least one of: hydrogen ($H_2$), argon (Ar), helium (He), ammonia ($NH_3$), etc.

In some embodiments, the dielectric material is a silicon carbide material (e.g., Sic). Examples of single source precursors for RID processes used to form silicon carbide materials include carbosilanes and carbosilane derivatives. For example, a siloxane derivative can be created by replacing at least one hydrogen (H) atom in a carbosilane with at least one of: a methyl group, an alkyl group, an alkene group, an alkyne group, or an aryl group having between 1 carbon atom to about 12 carbon atoms (C1-C12).

In some embodiments, an RID process uses a bimolecular approach. During a biomolecular approach, two precursors are used to form the dielectric material. For example, the reaction $R_{(4-n)}SiX_n$+R'OR"+plasma can form $SiO_2$ or silicon oxycarbide (SiCO), and the reaction $R_{(4-n)}Si(NR')_n$+R"OH+plasma can form $Si_3N_4$ or silicon oxycarbonitride (SiCON), where R, R', R" are each selected from the following: H, alkyl/alkene/alkyne/aryl up to C10 (i.e., up to 10 carbons), and X is a halide (e.g., F, Cl, Br, I).

In some embodiments, the RID process using the bimolecular approach is performed at a temperature ranging from about −70° C. to about 700° C. In some embodiments, the RID process using the bimolecular approach is performed at pressure that ranges from about 1 milliTorr (mTorr) to about 100 Torr. The plasma can be a capactively coupled plasma (CCP), inductively coupled plasma (ICP) or a microwave plasma, etc. In some embodiments, an inhibitor can be used during the RID process. For example, an inhibitor can be a self-assembled monolayer (SAM). Examples of inhibitors include alcohol, carboxylic acid, silyl amides, silyl alkoxide, alkyl silyl halides, etc.

In some embodiments, an RID process is a low-temperature deposition process. More specifically, a deposition precursor can be introduced at a low temperature to form a condensed film, and the condensed film can be densified using a directional plasma process. For example, the deposition precursor can be a silicon (Si) precursor such as a siloxane. The low temperature can cause the deposition precursor to condense. A RF treatment process can be performed to densify the condensed precursor using plasma. The low-temperature deposition process can be performed at any suitable temperature. In some embodiments, low-temperature deposition process is performed at a sub-zero degree temperature. For example, the low-temperature deposition process can be performed at a temperature of less than about 0° C. As another example, the low-temperature deposition process can be performed at a temperature of less than or equal to about-10° C. As another example, the low-temperature deposition process can be performed at a temperature of less than or equal to about −20° C. As another example, the low-temperature deposition process can be performed at a temperature of less than or equal to about −30° C. As yet another example, the low-temperature deposition process can be performed at a temperature of less than or equal to about −40° C. As yet another example, the low-temperature deposition process can be performed at a temperature of less than or equal to about −50° C. In some embodiments, the low-temperature deposition process is performed at an above-zero-degree temperature. More particularly, the low-temperature deposition process can be performed at a temperature of greater than about 0° C.

An RID process described herein can be used as part of a gap fill process during fabrication of an electronic device. Generally, fabricating an electronic device can include obtaining a patterned substrate including a set of openings and a set of features, using an RID process to form dielectric material within each opening of the set of openings and on each feature of the set of features to obtain an intermediate structure, and processing the intermediate structure to obtain the electronic device. The patterned substrate can include a substrate. The substrate can include one or more layers including a substrate layer. For example, the substrate layer can be a silicon (Si) substrate layer. Each feature of the set of features can have any suitable aspect ratio in accordance with embodiments described herein. In some embodiments, the set of features includes a set of high aspect ratio features. Aspect ratio refers to the ratio of the height of a feature to the width of the feature (e.g., critical dimension). In some implementations, a high aspect ratio feature can have a height-to-width ratio of greater than or equal to about 30:1. In some embodiments, a high aspect ratio feature can have a height-to-width ratio of greater than or equal to about 40:1. In some embodiments, a high aspect ratio feature can have a height-to-width ratio of greater than or equal to about 50:1. In some embodiments, a high aspect ratio feature can have a height-to-width ratio of greater than or equal to about 60:1. For example, the length of a feature can be about 1000 nanometers (nm) and the width of the feature can be about 16 nm (e.g., an aspect ratio of about 62.5:1). Each feature of the set of features can include any suitable width in accordance with embodiments described herein. In some embodiments, the width of a feature can be less than or equal to about 50 nm. In some embodiments, the width of a feature can be less than or equal to about 40 nm. In some embodiments, the width of a feature can be less than or equal to about 30 nm. In some embodiments, the width of a feature can be less than or equal to about 20 nm.

In some embodiments, an electronic device is fabricated using a leave on mask process. Fabricating an electronic device using a leave on mask process can include obtaining the patterned substrate by etching a base structure including an etch mask disposed on a substrate, using the RID process to form dielectric material within each opening of the set of openings and on each feature of the set of features to obtain the intermediate structure, and processing the intermediate structure to obtain the intermediate device. More specifically, obtaining the patterned substrate can include forming, on each feature of the set of features, a respective etch mask portion of a set of etch mask portions, using the RID process to form the dielectric material can include forming dielectric material on each etch mask portion of the set of etch mask portions, and processing the intermediate structure can include removing the set of etch mask portions from the patterned substrate. In some embodiments, obtaining the base structure includes forming the etch mask on the substrate. The etch mask can include a material that enables formation of the features from the substrate using dry etching. In some embodiments, the etch mask is a silicon-containing etch mask. For example, the etch mask can include silicon oxynitride (SiON). In some embodiments, the etch mask is a boron-containing etch mask. For example, the etch mask can include boron nitride (BN).

In some embodiments, an electronic device is fabricated using a level selective removal process. Fabricating an electronic device using a level selective removal process can include obtaining the patterned substrate, using the RID process to form dielectric material within each opening of the set of openings and on each feature of the set of features to obtain the intermediate structure, and processing the intermediate structure to obtain the electronic device including removing excess dielectric material using a level selective removal process. For example, the patterned substrate can be a preformed patterned substrate that does not include an etch mask, and dielectric material can be formed directly on each feature of the set of features. As another example, the patterned substrate can be formed by patterning a substrate.

In some embodiments, an electronic device is fabricated using a polymer fill removal process. Fabricating an electronic device using a polymer fill removal process can include obtaining a patterned substrate including a set of openings and a set of features, using an RID process to form dielectric material within each opening of the set of openings and on each feature of the set of features to obtain the intermediate structure, and processing the intermediate structure to obtain the electronic device including forming a polymer on the dielectric material within each opening of the set of openings, removing the dielectric material disposed on each feature of the set of features, and removing the polymer material from each opening of the set of openings. More specifically, the patterned substrate can be a preformed patterned substrate that does not include an etch mask, and dielectric material can be formed directly on each feature of the set of features. Further details regarding RID processes for dielectric material formation will be described below with reference to FIGS. 1A-6C.

Figure 1B:
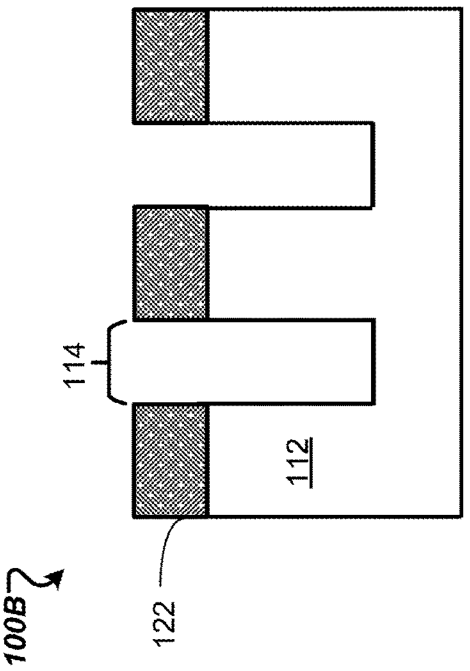
Figure 1C:
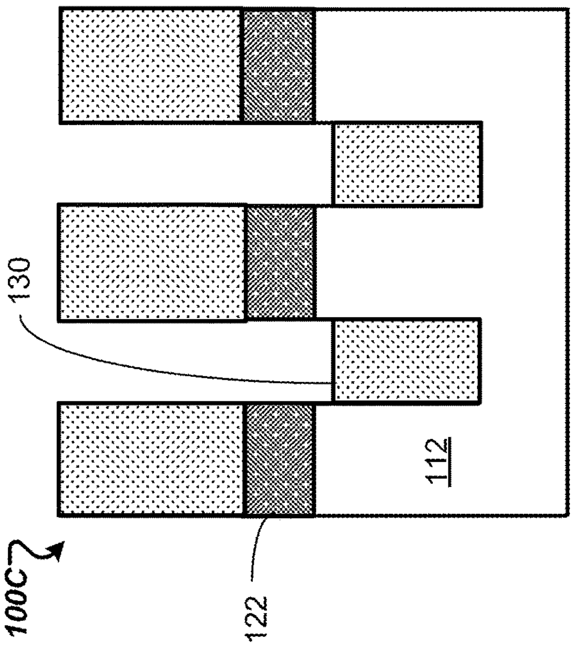
Figure 1D:
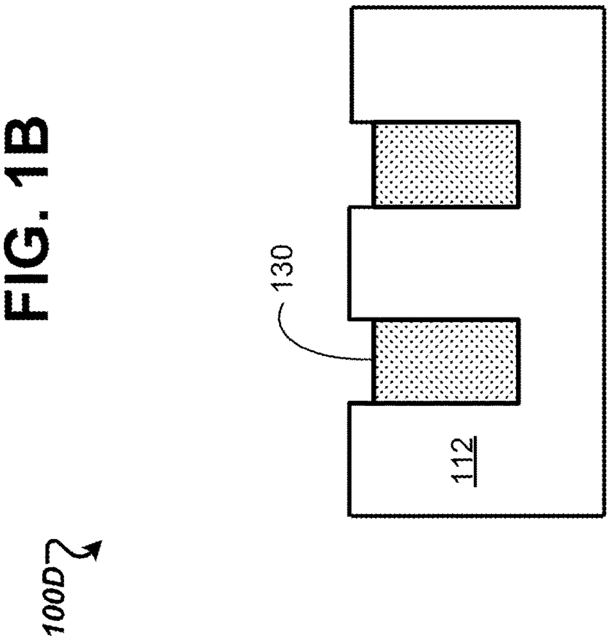

FIGS. 1A-1D are cross-sectional diagrams of an example method of performing a leave-on mask RID scheme, in accordance with some embodiments. FIG. 1A is a diagram 100A of a base structure including substrate 110 and mask layer 120 formed on substrate 110. Substrate 110 can include one or more layers including an initial substrate layer. In some embodiments, the initial substrate layer includes silicon (Si). In some embodiments, obtaining the base structure includes forming the etch mask on the substrate. Etch mask 120 can include a material that enables formation of the features from the substrate using dry etching. The material of etch mask 120 can be selected based on the material of substrate 110 and/or target etch selectivity. In some embodiments, the etch mask is a silicon-containing etch mask. For example, the etch mask can include silicon oxynitride (SiON). In some embodiments, the etch mask is a boron-containing etch mask. For example, the etch mask can include boron nitride (BN). FIG. 1B is a diagram 100B showing patterning of the base structure to form a set of features including feature 112, a set of openings including opening 114, and a set of mask layer portions including mask layer portion 122. FIG. 1C is a diagram 100C showing the formation of dielectric material 130 using an RID process to obtain an intermediate structure. More specifically, dielectric material 130 can be formed within each opening of the set of openings including opening 114, and on each feature of the set of features including feature 122. In some embodiments, the RID process is a single source precursor process. In some embodiments, the RID process uses a biomolecular approach. In some embodiments, the RID processes is a low-temperature deposition process. FIG. 1D is a diagram 100D showing the processing of the intermediate structure. Processing the intermediate structure can include removing the set of etch mask portions (and the dielectric material disposed on the set of etch mask portions). For example, removing the set of etch mask portions can include performing a planarization method (e.g., chemical-mechanical polishing (CMP)).

Figure 2A:
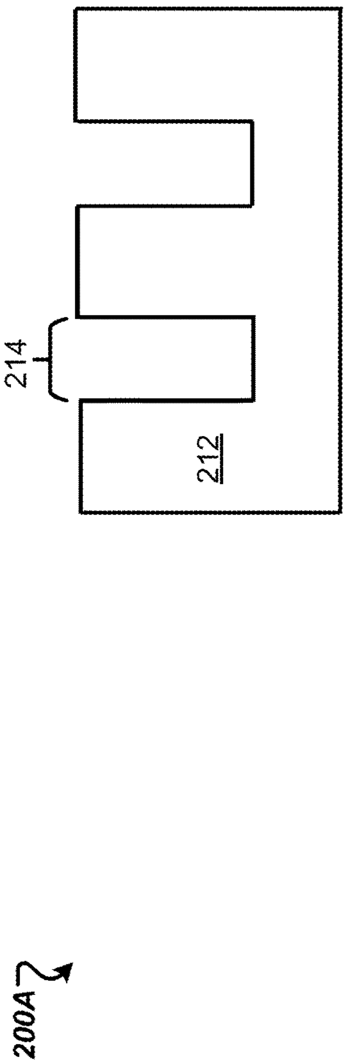
FIGS. 2A-2C are cross-sectional diagrams of an example method of performing a level selective removal reactive-ion deposition (RID) scheme, in accordance with some embodiments.
Figure 2B:
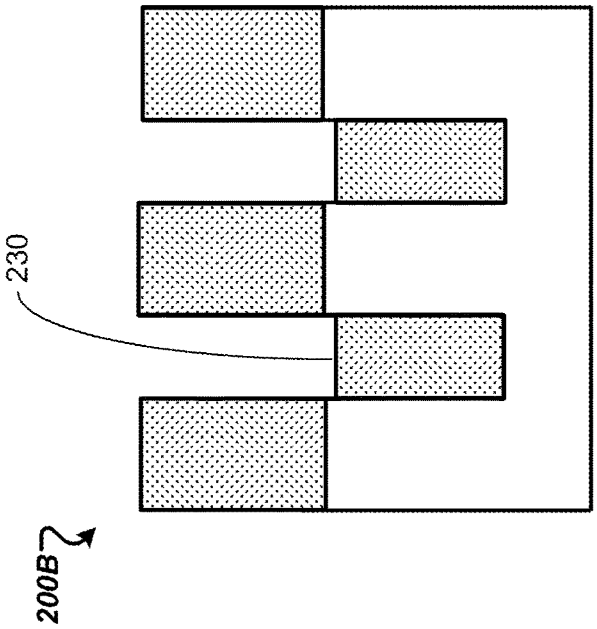
Figure 2C:
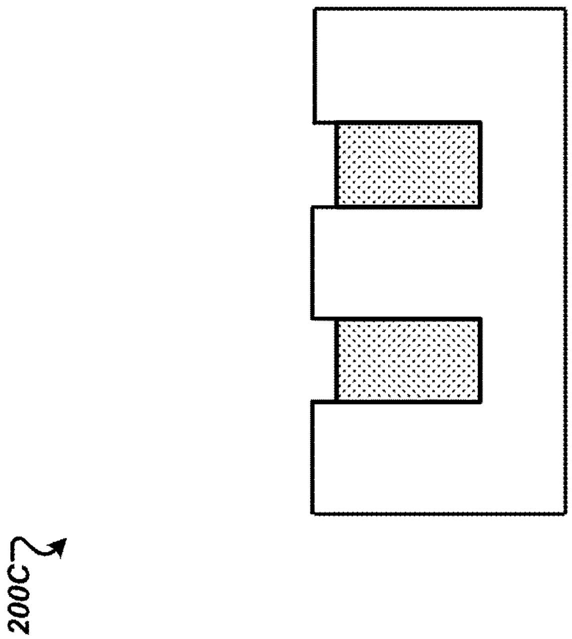

FIGS. 2A-2C are cross-sectional diagrams of an example method of performing a level selective removal reactive-ion deposition (RID) scheme, in accordance with some embodiments. FIG. 2A is a diagram 200A of a patterned substrate including a set of features including feature 212 and a set of openings including opening 214. In some embodiments, the patterned substrate is preformed. In some embodiments, the patterned substrate is formed by patterning a substrate (e.g., similar to FIGS. 1A-1B). FIG. 2B is a diagram 200B showing the formation of dielectric material 230 using an RID process to obtain an intermediate structure. More specifically, dielectric material 230 can be formed within each opening of the set of openings including opening 214, and on each feature of the set of features including feature 222. In some embodiments, the RID process is a single source precursor process. In some embodiments, the RID process uses a biomolecular approach. In some embodiments, the RID processes is a low-temperature deposition process. FIG. 2C is a diagram 200C showing the processing of the intermediate structure. Processing the intermediate structure can include removing the dielectric material formed on the set of features using level selective removal.

Figure 3A:
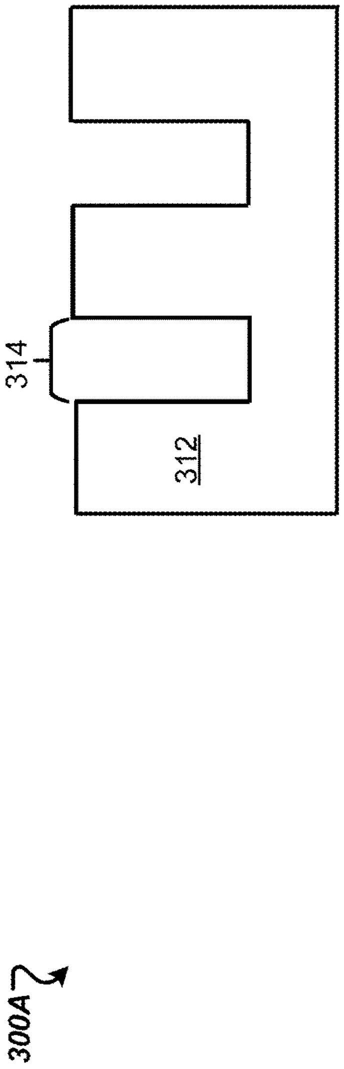
FIGS. 3A-3E are diagrams of an example method of performing a polymer fill removal reactive-ion deposition (RID) scheme, in accordance with some embodiments.
Figure 3B:
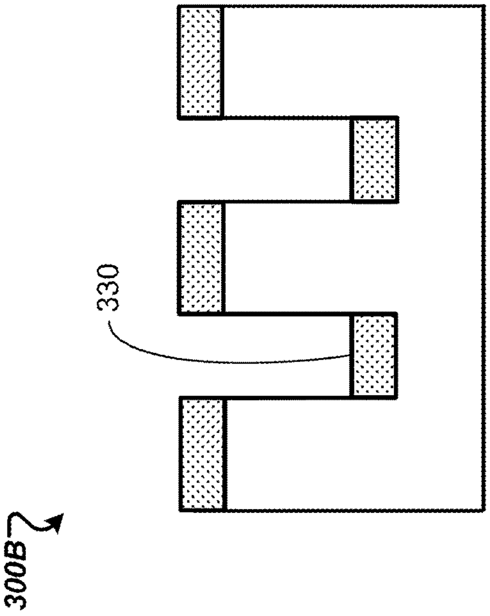
Figure 3C:
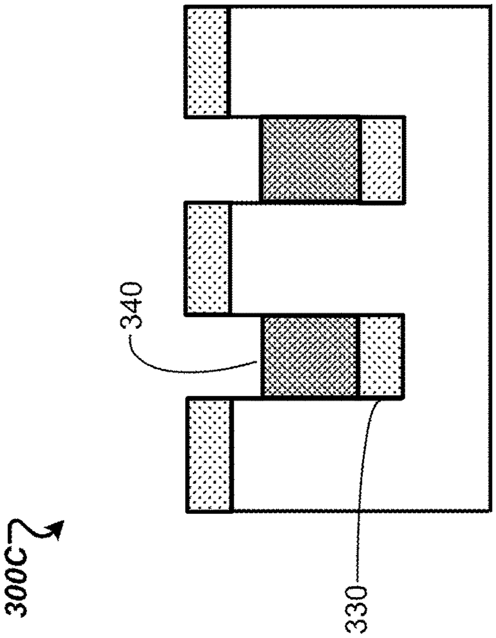
Figure 3E:
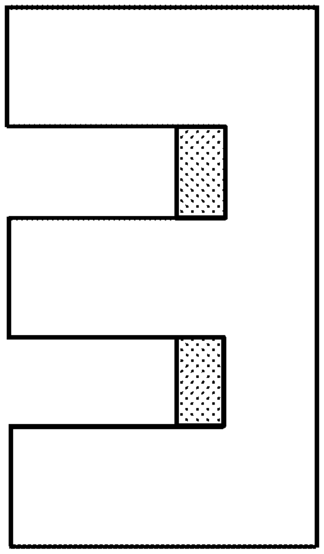
Figure 3D:
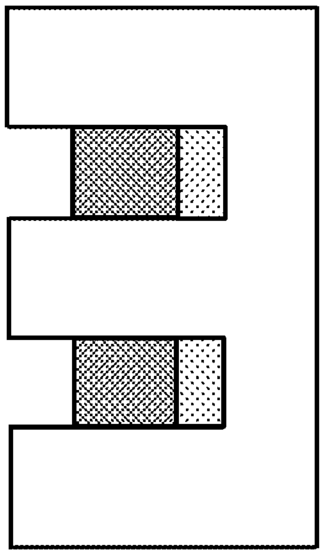

FIGS. 3A-3E are diagrams of an example method of performing a polymer fill removal reactive-ion deposition (RID) scheme, in accordance with some embodiments. FIG. 3A is a diagram 300A of a patterned substrate including a set of features including feature 312 and a set of openings including opening 314. In some embodiments, the patterned substrate is preformed. In some embodiments, the patterned substrate is formed by patterning a substrate (e.g., similar to FIGS. 1A-1B). FIG. 3B is a diagram 300B showing the formation of dielectric material 330 using an RID process to obtain an intermediate structure. More specifically, dielectric material 330 can be formed within each opening of the set of openings including opening 314, and on each feature of the set of features including feature 322. In some embodiments, the RID process is a single source precursor process. In some embodiments, the RID process uses a biomolecular approach. In some embodiments, the RID processes is a low-temperature deposition process. FIG. 3C is a diagram 300C showing the formation of polymer material 340 on the portion of dielectric material 330 within each opening of the set openings. FIG. 3D is a diagram 300D showing the removal of portions of the dielectric material 330 disposed on the set of features. FIG. 3E is a diagram 300E showing the removal of polymer material 340 from each opening of the set of openings.

In some embodiments, polymer material 340 includes a flowable polymer film. A flowable material is one which, under the proper conditions will flow by gravity to the low point of a substrate surface and/or by capillary action to narrow critical dimension (CD) spaces of trenches or other features.

In some embodiments, forming polymer material 340 includes exposing a surface to one or more monomers. In some embodiments, the monomers include a single, bi-functional monomer, each functional group being different. In this way, one functional group of a monomer molecule will react with the other functional group of a different monomer molecule. Those skilled in the art may recognize this as an "A" polymer. In some embodiments, the one or more monomers include methacrylate, styrene, benzyl alcohol, benzyl chloride or derivatives thereof. As used in this regard, a derivative of a base molecule may contain one or more group comprising 1-10 carbon atoms. For example, in some embodiments, the methacrylate compound has a general formula of:

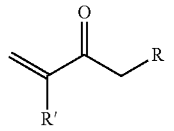

where R is a group including 1-10 carbon atoms and R' is a group including 1-6 carbon atoms. As used in this regard, a "carbon group" may be linear, branched, cyclic, saturated or unsaturated. Additionally, a styrene derivative monomer may include a group on the benzene ring with 0-10 carbon atoms and an R' group on the vinyl comprising 1-6 carbon atoms. A benzyl alcohol derivative monomer or a benzyl chloride derivative monomer may include a group on the benzene ring comprising 0-10 carbon atoms and a R' group on the benzyl carbon comprising 1-6 carbon atoms.

In some embodiments, the monomers include two bifunctional monomers, each functional group being the same. In this way the functional groups of one monomer react with the functional groups of a second monomer. Those skilled in the art may recognize this as an "AB" polymer.

In some embodiments, the monomers include at least two amine, aldehyde, ketone, or alcohol groups. In some embodiments, the monomers have a general formula of X—R"—X, where X is a functional group selected from $NH_2$, NHR', O, OH, CHO, CR'O, COOH, or COOR', R' is a group comprising 1-6 carbon atoms, and R" is a group including 1-15 carbon atoms. In some embodiments, R' includes 1-4 carbon atoms. In some embodiments, R" is an ethylene or propylene group. In specific embodiments, the monomers comprise terephthalic acid (TPA, $C_6H_4(COOH)_2$) and ethylene diamine ($C_2H_4(NH_2)_2$).

In some embodiments, the monomers include a monofunctional monomer. When combined with the above embodiments, those skilled in the art may recognize this as an "AC" or "ABC" polymer. Without being bound by theory, in these embodiments, it is believed that the monofunctional monomer acts as a terminal group and limits any further chain reactions.

In some embodiments, the monofunctional monomer comprises an amine, aldehyde, ketone, or alcohol group. In some embodiments, the monofunctional monomer has a general formula of RX, where R is a group including 1-10 carbon atoms, X is a functional group selected from $NH_2$, NHR', O, OH, or COOH, and R' is a group including 1-6 carbon atoms.

In order to control the "flowability" of the resulting film, it has been found that it may be necessary to control the size of the resulting oligomers. Accordingly, in some embodiments, the formation of polymer material 340 is performed on a substrate maintained at a temperature in a range of 0° C. to 400° C. In some embodiments, the substrate is maintained at a temperature greater than or equal to about 0° C., greater than or equal to about 30° C., greater than or equal to about 50° C., greater than or equal to about 100° C., greater than or equal to about 200° C., or greater than or equal to about 300° C. In some embodiments, the substrate is maintained at a temperature less than or equal to about 400° C., less than or equal to about 300° C., less than or equal to about 200° C., less than or equal to about 100° C., less than or equal to about 50° C., or less than or equal to about 30° C. Further, other process parameters may be controlled during the formation of polymer material 340. Examples of parameters which may be controlled include, but are not limited to: processing chamber pressure, monomer selections, the use of an inert diluent or carrier gas, partial pressures of monomers, pulse sequence of monomers, and pause periods to permit flow of the polymer material.

Figure 4:
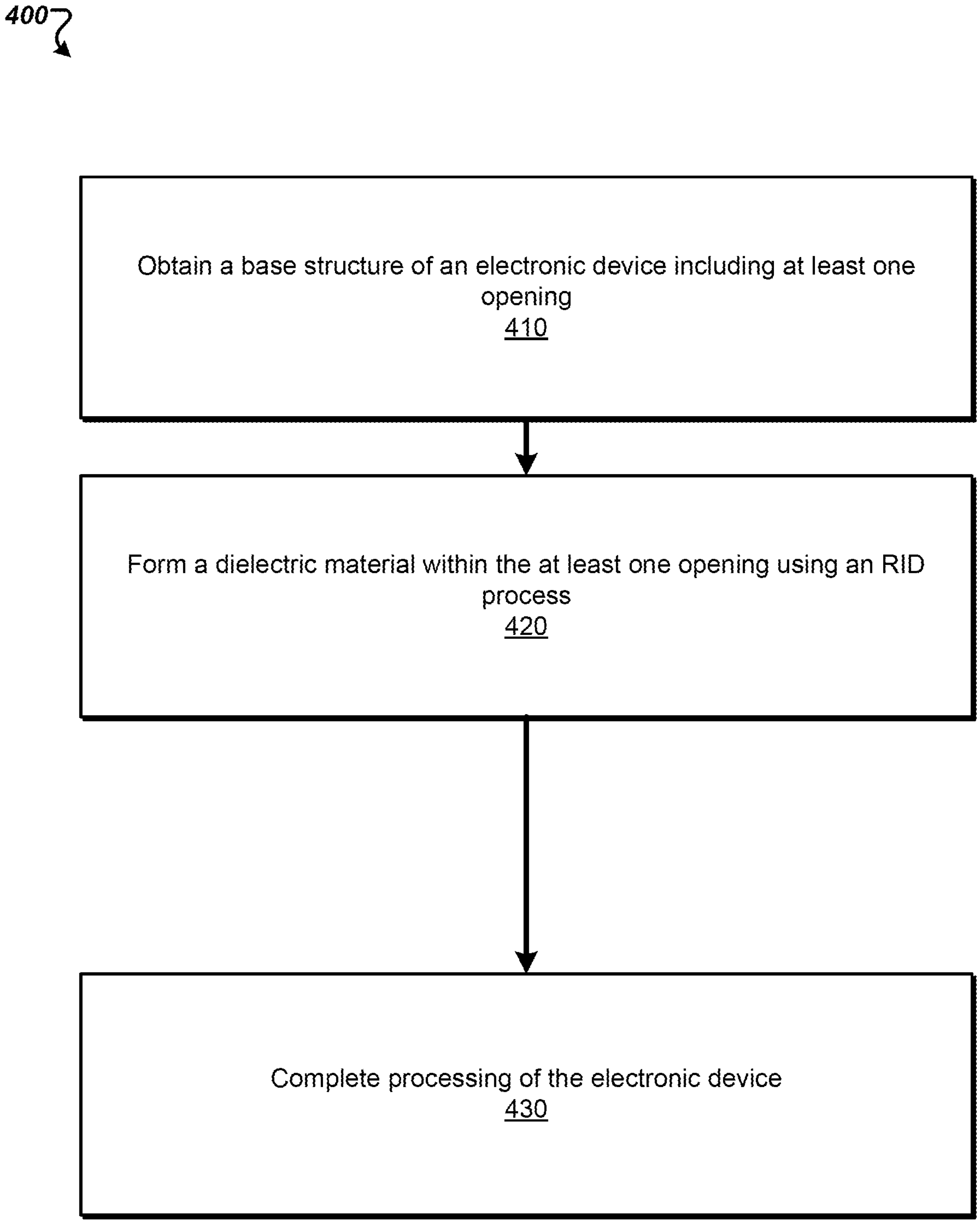
FIG. 4 is a flowchart of an example method of implementing a reactive-ion deposition (RID) process for dielectric material formation, in accordance with some embodiments.

FIG. 4 is a flowchart of an example method of implementing an RID processes for dielectric material formation, in accordance with some embodiments. At block 410, a base structure including at least one opening is obtained. More specifically, the base structure can include at least one opening and at least one feature. In some embodiments, obtaining the base structure includes receiving a preformed base structure. In some embodiments, obtaining the base structure includes forming the base structure from a substrate.

At block 420, a dielectric material is formed within the at least one opening using an RID process. Generally, RID involves using high energy directional ions to deposit a target layer (e.g., film). Due to directionality of the plasma treatment, the target layer can be grown bottom-up without growing significant amount of material on sidewalls of the structure. For example, plasma can be generated from a gas mixture including a process gas. The plasma can include reactive species such as charged particles (e.g., ions) and/or neutral particles (e.g., atoms and/or radicals). The surface of the at least one exposed region of the target layer reacts with the plasma, which results in the etching of the exposed portions of the target layer. The type of process gas within the gas mixture is dependent on the material of the target layer. The reactions between the target layer and the reactive species can generate volatile etch byproducts (e.g., smaller molecules), which can be removed by a vacuum system. The gas mixture can further include an inert gas. For example, the inert gas can include a noble gas, such as helium (He), argon (Ar), neon (Ne), xenon (Xe), krypton (Kr), radon (Rn), etc. In some implementations, the gas mixture can include a mixture of inert gases (i.e., an inert gas mixture). The inert gas (or inert gas mixture) can be used to dilute the gas mixture to control material deposition.

In some embodiments, a dielectric material is a silicon-containing dielectric material. Examples of silicon containing dielectric materials include silicon oxide ($SiO_x$) materials, silicon nitride (SiN) materials, silicon carbide (SiC) materials, silicon oxycarbide (SiCO) materials, silicon oxycarbonitride (SiCON) materials, etc.

In some embodiments, an RID process is a single source precursor process that utilizes a single source precursor to form a dielectric material. More specifically, a single source precursor can be used with a suitable plasma.

In some embodiments, the dielectric material is a silicon oxide material (e.g., $SiO_2$) Examples of single source precursors for RID processes that can be used to form silicon oxide materials include siloxanes and siloxane derivatives (e.g., replacing at least one hydrogen (H) atom in a siloxane with a methyl group ($CH_3$). Examples of suitable plasmas for RID processes that can be used to form silicon oxide materials include oxygen ($O_2$)-containing plasmas and/or ammonia ($NH_3$)-containing plasmas.

In some embodiments, the dielectric material is a silicon nitride material (e.g., $Si_3N_4$). Examples of single source precursors for RID processes that can be used to form silicon nitride materials include silazanes or aminosilanes, and derivatives of silazanes or aminosilanes. Examples of suitable plasmas for RID processes that can be used to form silicon nitride materials include $NH_3$ containing plasmas.

In some embodiments, the dielectric material is a silicon carbide material (e.g., Sic). Examples of single source precursors for RID processes used to form silicon carbide materials include carbosilanes and carbosilane derivatives (e.g., replacing at least one H atom in a carobsilane with $CH_3$).

In some embodiments, an RID process uses a bimolecular approach. During a biomolecular approach, two precursors are used to form the dielectric material. For example, the reaction $R_{(4-n)}SiX_n$+R'OR"+plasma can form $SiO_2$ or silicon oxycarbide (SiCO), and the reaction $R_{(4-n)}Si(NR')_n$+R"OH+plasma can form $Si_3N_4$ or silicon oxycarbonitride (SiCON), where R, R', R" are each selected from the following: H, alkyl/aryl up to C10 (i.e., up to 10 carbons), and X is a halide (e.g., F, Cl, Br, I).

In some embodiments, the RID process using the bimolecular approach is performed at a temperature ranging from about −70° C. to about 700° C. In some embodiments, the RID process using the bimolecular approach is performed at pressure that ranges from about 1 milliTorr (mTorr) to about 100 Torr. The plasma can be a CCP, an ICP, a microwave plasma, etc. In some embodiments, an inhibitor can be used during the RID process. For example, an inhibitor can be a SAM. Examples of inhibitors include alcohol, carboxylic acid, silyl amides, silyl alkoxide, alkyl silyl halides, etc.

In some embodiments, an RID process is a low-temperature deposition process. More specifically, a deposition precursor can be introduced at a low temperature to form a condensed film, and the condensed film can be densified using a directional plasma process. For example, the deposition precursor can be an Si precursor such as a siloxane. The low temperature can cause the deposition precursor to condense. A RF treatment process can be performed to densify the condensed precursor using plasma. The low-temperature deposition process can be performed at any suitable temperature. In some embodiments, low-temperature deposition process is performed at a sub-zero degree temperature. For example, the low-temperature deposition process can be performed at a temperature of less than about 0° C. As another example, the low-temperature deposition process can be performed at a temperature of less than or equal to about −10° C. As another example, the low-temperature deposition process can be performed at a temperature of less than or equal to about −20° C. As another example, the low-temperature deposition process can be performed at a temperature of less than or equal to about −30° C. As yet another example, the low-temperature deposition process can be performed at a temperature of less than or equal to about −40° C. As yet another example, the low-temperature deposition process can be performed at a temperature of less than or equal to about −50° C. In some embodiments, the low-temperature deposition process is performed at an above-zero-degree temperature. More particularly, the low-temperature deposition process can be performed at a temperature of greater than about 0° C.

An RID process described herein can be used as part of a gap fill process during fabrication of an electronic device. Generally, fabricating an electronic device can include obtaining a patterned substrate including a set of openings and a set of features, using an RID process to form dielectric material within each opening of the set of openings and on each feature of the set of features to obtain an intermediate structure, and processing the intermediate structure to obtain the electronic device. The patterned substrate can include a substrate. The substrate can include one or more layers including a substrate layer. For example, the substrate layer can be a silicon (Si) substrate layer. Each feature of the set of features can have any suitable aspect ratio in accordance with embodiments described herein. In some embodiments, the set of features includes a set of high aspect ratio features. Aspect ratio refers to the ratio of the height of a feature to the width of the feature (e.g., critical dimension). In some implementations, a high aspect ratio feature can have a height-to-width ratio of greater than or equal to about 30:1. In some embodiments, a high aspect ratio feature can have a height-to-width ratio of greater than or equal to about 40:1. In some embodiments, a high aspect ratio feature can have a height-to-width ratio of greater than or equal to about 50:1. In some embodiments, a high aspect ratio feature can have a height-to-width ratio of greater than or equal to about 60:1. For example, the length of a feature can be about 1000 nanometers (nm) and the width of the feature can be about 16 nm (e.g., an aspect ratio of about 62.5:1). Each feature of the set of features can include any suitable width in accordance with embodiments described herein. In some embodiments, the width of a feature can be less than or equal to about 50 nm. In some embodiments, the width of a feature can be less than or equal to about 40 nm. In some embodiments, the width of a feature can be less than or equal to about 30 nm. In some embodiments, the width of a feature can be less than or equal to about 20 nm.

At block 430, processing of the electronic device is completed. Completing processing of the electronic device can include removing a portion of the dielectric material formed using the RID process.

Blocks 410-430 can be performed as part of an RID integration scheme to fabricate an electronic device. In some embodiments, the RID integration scheme is a leave on mask process. Fabricating an electronic device using a leave on mask process can include obtaining the patterned substrate by etching a base structure including an etch mask disposed on a substrate, using the RID process to form dielectric material within each opening of the set of openings and on each feature of the set of features to obtain the intermediate structure, and processing the intermediate structure to obtain the intermediate device. More specifically, obtaining the patterned substrate can include forming, on each feature of the set of features, a respective etch mask portion of a set of etch mask portions, using the RID process to form the dielectric material can include forming dielectric material on each etch mask portion of the set of etch mask portions, and processing the intermediate structure can include removing the set of etch mask portions from the patterned substrate. In some embodiments, obtaining the base structure includes forming the etch mask on the substrate. The etch mask can include a material that enables formation of the features from the substrate using dry etching. In some embodiments, the etch mask is a silicon-containing etch mask. For example, the etch mask can include silicon oxynitride (SiON). In some embodiments, the etch mask is a boron-containing etch mask. For example, the etch mask can include boron nitride (BN). Further details regarding the leave on mask scheme are described above with reference to FIGS. 1A-1D.

In some embodiments, the RID integration scheme is a level selective removal process. Fabricating an electronic device using a level selective removal process can include obtaining the patterned substrate, using the RID process to form dielectric material within each opening of the set of openings and on each feature of the set of features to obtain the intermediate structure, and processing the intermediate structure to obtain the electronic device including removing excess dielectric material using a level selective removal process. For example, the patterned substrate can be a preformed patterned substrate that does not include an etch mask, and dielectric material can be formed directly on each feature of the set of features. As another example, the patterned substrate can be formed by patterning a substrate. Further details regarding the level selective removal scheme are described above with reference to FIGS. 2A-2C.

In some embodiments, the RID integration scheme is a polymer fill scheme. Fabricating an electronic device using a polymer fill removal process can include obtaining a patterned substrate including a set of openings and a set of features, using an RID process to form dielectric material within each opening of the set of openings and on each feature of the set of features to obtain the intermediate structure, and processing the intermediate structure to obtain the electronic device including forming a polymer on the dielectric material within each opening of the set of openings, removing the dielectric material disposed on each feature of the set of features, and removing the polymer material from each opening of the set of openings. More specifically, the patterned substrate can be a preformed patterned substrate that does not include an etch mask, and dielectric material can be formed directly on each feature of the set of features. Further details regarding the polymer fill scheme are described above with reference to FIGS. 3A-3E. Further details regarding RID processes for dielectric material formation are described above with reference to FIGS. 1A-3E and will now be described below with reference to FIGS. 5A-5C.

Figure 5A:
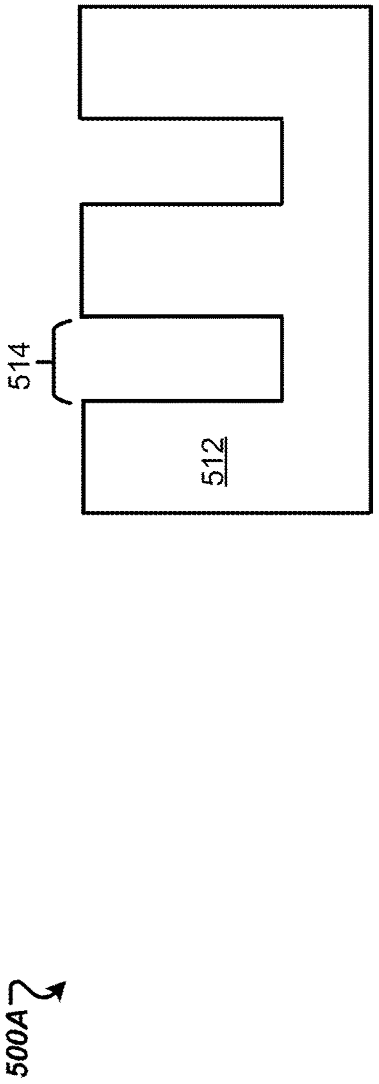
FIGS. 5A-5C are diagrams of an example method of performing reactive-ion deposition (RID), in accordance with some embodiments.
Figure 5B:
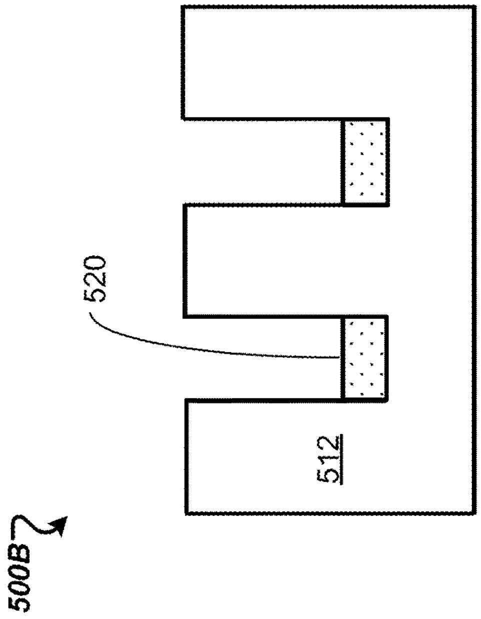
Figure 5C:
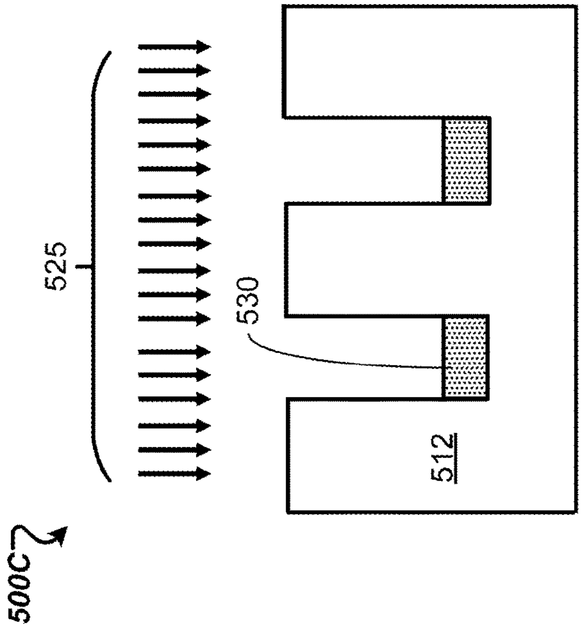

FIGS. 5A-5C are diagrams of an example method of performing reactive-ion deposition (RID), in accordance with some embodiments. FIG. 5A is a diagram 500A of a patterned substrate including a set of features including feature 512 and a set of openings including opening 514. In some embodiments, the patterned substrate is preformed. In some embodiments, the patterned substrate is formed by patterning a substrate (e.g., similar to FIGS. 1A-1B). FIG. 5B is a diagram 500B showing precursor 520 formed at the bottom of the set of openings including opening 514. In some embodiments, the RID process is a low-temperature deposition process and precursor 520 condenses at the bottom of the set of openings due to the low temperature. The temperature can be selected based on the type of precursor to enable precursor condensation. For example, the temperature can be selected based on the melting point of the type of precursor (e.g., within a range of about ∓50° C. of the melting point). FIG. 5C is a diagram 500C showing directional (plasma) reactive species (e.g., ions and/or radicals) 525 being directed toward precursor 520. Directional reactive species 525 can densify the condensed material within the set of openings to form dielectric material 530.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:

obtaining a base structure of an electronic device, the base structure comprising at least one opening defined by a bottom surface and sidewalls; and forming, using a reactive-ion directional plasma treatment deposition process, a dielectric material within the at least one opening in an upward direction from the bottom surface to reduce formation of the dielectric material on the sidewalls.

2. The method of claim 1, wherein the dielectric material is a silicon oxide material.

3. The method of claim 1, wherein the dielectric material is a silicon nitride material.

4. The method of claim 1, wherein the dielectric material is a silicon carbide material.

5. The method of claim 1, wherein the reactive-ion directional plasma treatment deposition process is a single precursor deposition process.

6. The method of claim 5, wherein the single precursor deposition process uses, as a precursor, at least one of: a siloxane or a siloxane derivative.

7. The method of claim 5, wherein the single precursor deposition process uses, as a precursor, at least one of: an aminosilane, a silazane, an aminosilane derivative, or a silazane derivative.

8. The method of claim 5, wherein the single precursor deposition process uses, as a precursor, at least one of: a carbosilane or a carbosilane derivative.

9. The method of claim 1, wherein the reactive-ion directional plasma treatment deposition process uses a biomolecular approach.

10. The method of claim 1, wherein the reactive-ion directional plasma treatment deposition process is a low temperature deposition process performed at a temperature less than or equal to about 0° C.

11. The method of claim 1, wherein obtaining the base structure comprises patterning a mask layer disposed on a substrate to form the at least one opening and at least one mask layer portion, and wherein the dielectric material is formed within the at least one opening and on the at least one mask layer portion.

12. The method of claim 1, further comprising performing level selective removal to remove dielectric material formed on at least one feature of the base structure.

13. The method of claim 1, further comprising:

forming a polymer material on the dielectric material;

after forming the polymer material, removing dielectric material formed on at least one feature of the base structure; and removing the polymer material after removing the dielectric material formed on the at least one feature.

14. A method comprising:

obtaining a base structure of an electronic device, the base structure comprising at least one opening defined by a bottom surface and sidewalls; and forming, using a reactive-ion directional plasma treatment deposition process, a dielectric material within the at least one opening in an upward direction from the bottom surface to reduce formation of the dielectric material on the sidewalls, wherein the dielectric material comprises at least one of: a silicon oxide material, a silicon nitride material, or a silicon carbide material.

15. The method of claim 14, wherein the reactive-ion directional plasma treatment deposition process is a single precursor deposition process, and wherein the single precursor deposition process uses, as a precursor, at least one of: a siloxane, a siloxane derivative, an aminosilane, a silazane, an aminosilane derivative, a silazane derivative, a carbosilane, or a carbosilane derivative.

16. The method of claim 14, wherein the reactive-ion directional plasma treatment deposition process uses a biomolecular approach.

17. The method of claim 14, wherein the reactive-ion directional plasma treatment deposition process is a low temperature deposition process performed at a temperature less than or equal to about 0° C.

18. The method of claim 14, wherein obtaining the base structure comprises patterning a mask layer disposed on a substrate to form the at least one opening and at least one mask layer portion, and wherein the dielectric material is formed within the at least one opening and on the at least one mask layer portion.

19. The method of claim 14, further comprising performing level selective removal to remove dielectric material formed on at least one feature of the base structure.

20. The method of claim 14, further comprising:

forming a polymer material on the dielectric material;

after forming the polymer material, removing dielectric material formed on at least one feature of the base structure; and removing the polymer material after removing the dielectric material formed on the at least one feature.

* * * * *